United States Patent [19]

Deweck

[11] Patent Number: 4,492,931
[45] Date of Patent: Jan. 8, 1985

[54] INFRA-RED RECEIVER FRONT END

[75] Inventor: Lionel Deweck, Mont de Vaux, Switzerland

[73] Assignee: Motorola, Inc., Schaumburg, Ill.

[21] Appl. No.: 629,739

[22] Filed: Jul. 9, 1984

Related U.S. Application Data

[63] Continuation of Ser. No. 396,553, Jul. 9, 1982.

[51] Int. Cl.³ .............................................. H03F 1/34
[52] U.S. Cl. .................................. 330/294; 330/107; 330/109; 330/59
[58] Field of Search ................... 330/59, 85, 107, 109, 330/290, 293, 294, 308

[56] References Cited

U.S. PATENT DOCUMENTS

| | | | |
|---|---|---|---|
| 4,210,872 | 7/1980 | Gregorian | 330/109 X |
| 4,227,155 | 10/1980 | Lerma | 330/85 X |
| 4,275,357 | 6/1981 | Nakayama et al. | 330/107 |

Primary Examiner—James B. Mullins
Assistant Examiner—Steven J. Mottola
Attorney, Agent, or Firm—Joe E. Barbee

[57] ABSTRACT

An infra-red receiver front-end includes a trans-impedance amplifier connected to receive an input current and provided with frequency selective transadmittance feedback between its output and input, the transadmittance feedback having a DC path to ground for low frequency noise components in the input current, caused by background illumination.

11 Claims, 7 Drawing Figures

INFRA-RED RECEIVER FRONT END

This application is a continuation of application Ser. No. 396,553, filed July 9, 1982.

TECHNICAL FIELD

This invention relates to a front end suitable for use in an Infra-Red receiver.

At the present time there is a growing requirement for the development of low cost short range communication systems for remote control. Particular requirements are for the remote control of television receivers and audio systems.

One of the most successful ways of providing this remote control is by the use of infra-red data transmission due to its considerable advantages over other methods. Amongst these advantages are the following:

(a) There is no interference with the rest of the electromagnetic spectrum.

(b) In comparison to radio frequency antennae, or acoustic transducers the infra-red transmitting and receiving elements are small.

(c) When used indoors the radiation is confined to the room where it is generated and causes no interference with similar systems operating in adjacent buildings.

(d) Infra-red radiation propogated through air suffers no significant absorption or scattering.

BACKGROUND ART

A typical infra-red transmission systems includes a transmitter and a receiver. The transmitter has an optical source typically a GAs light emitting diode (LED) whilst the receiver utilizes a photodetector typically a PIN photodiode for converting incident optical power into an electric current.

Infra-red signals received by the receiver are very weak at a distance from the source, the output current provided by the photodetector being in the nano ampere range. It is therefore essential to provide a preamplifier in the front end to amplify the weak incoming signals to digital voltage levels.

The sensitivity of the receiver is limited by the noise sources at the front end and therefore it is important that the preamplifier be low noise. Furthermore, when a receiver is used in artificial light or sunlight, a fluctuating infra-red component will be present in the received signal and this must be removed by suitable electrical filtering.

There are two known approaches to the design of preamplifiers for infra-red receivers. In one such approach a high input impedance (HZ) amplifier is used. This amplifier tends to integrate the incoming signals in view of its high input impedance and associated stray capacitance and to compensate for this the preamplifier is followed by an equalizer which has a high pass filter characteristic. A known example of such an arrangement is the Siemens TDA 4050.

A problem arises with the above HZ amplifier approach in that the load for the photodetector diode is usually a RLC tuned circuit in order to enable the preamplifier to have the required band pass filter characteristic at the desired signal frequency. This however requires the use of a coil, which cannot be integrated and therefore when the preamplifier is manufactured as an integrated circuit chip, as is desirable, the coil must be provided as an additional off-circuit component. This coil needs elaborate shielding if installed in a harsh electromagnetic environment. Also a RLC circuit is a relatively selective band pass filter and hence pulse trains, as used in conventional infra-red modulation schemes tend to be stretched due to ringing. This further complicates the reception of comprehensive signals.

An alternative approach is to use a transimpedance TZ amplifier. This has a low input impedance and therefore the photodiode stray capacitance causes no serious signal integration. A problem is caused however by low frequency noise due to background infra-red radiation. The amplifier does not adequately reject this low frequency noise and this tends to upset the bias point at the input to the amplifier.

This invention seeks to provide a front end suitable for use in an infra-red receiver in which the above mentioned problems of known front ends are mitigated.

BRIEF SUMMARY OF INVENTION

According to the present invention, there is provided a front end suitable for use in an infra-red receiver; the front end comprising a transimpedance amplifier connected to receive a front end input current and a frequency selective transadmittance feedback path connected between output and input of the transimpedance amplifier.

The transimpedance amplifier may comprise an operational amplifier having an input fed with the input current and negative feedback means connected between its output and the said input.

The said input of the operational amplifier may be the inverting input.

The negative feedback means may comprise a resistor connected between the output of the amplifier and the inverting input.

The transadmittance feedback path may include an integrating amplifier.

In one embodiment the integrating amplifier may comprise an operational amplifier having an input fed via resistive means from the output of the transimpedance amplifier and capacitive means connected between its output and the said input.

In another embodiment the integrating amplifier may comprise an operational amplifier having an input; capacitive means connected between an output of the amplifier and its input and a switchable capacitor arranged alternately to be charged by a voltage fed from the output of the transimpedance amplifier and to be discharged into the said input of the operational amplifier.

A smoothing filter may be connected to the output of the operational amplifier to reduce noise introduced by switching of the switchable capacitor.

BRIEF DESCRIPTION OF DRAWINGS

An exemplary embodiment of the invention will now be described with reference to the drawings in which;

FIG. 4a shows the transimpedance amplifier of FIG. 3 in more detail;

FIG. 4b is an equivalent circuit of the amplifier of FIG. 4a;

DETAILED DESCRIPTION OF THE INVENTION

Figure 1:
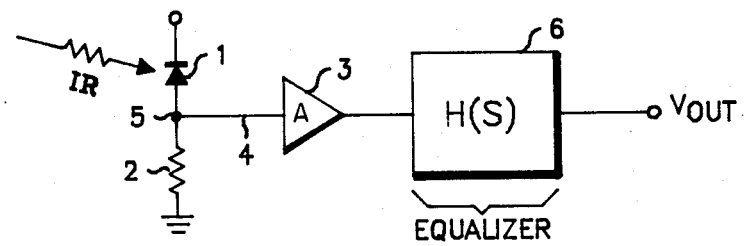
FIG. 1 is a highly schematic block diagram of one known form of front end for an infra-red receiver.

Referring now to FIG. 1 of the drawings, infra-red radiation falling on a photodetector diode 1 causes a current to flow in this diode. A resistor 2 is connected in series with the diode 1 so that current flowing through the diode also flows through the resistor 2 and generates a potential across it. A high input impedance amplifier 3 has an input 4 which is fed from a junction point 5 between the diode 1 and the resistor 2, with the potential induced across the resistor 2 by the infra-red radiation received by the photodetector diode 1.

As explained above, since the amplifier 3 has a high input impedance, it tends to integrate signals fed to it and therefore to compensate for this the amplifier 3 is connected to feed an equalizer 6. As explained above this front end has operational disadvantages and also is not easy to produce as an integrated circuit.

Figure 2:
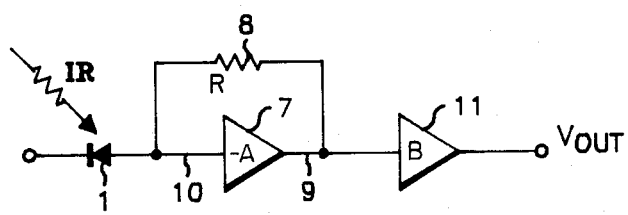
FIG. 2 shows an alternative known form of front end.

In FIG. 2 there is shown an alternative known front end circuit in which current produced by the photodetector diode 1 on irradiation by infra-red radiation is fed directly to a low input impedance transimpedance amplifier formed by an operational amplifier 7 provided with negative feedback in the form of a resistor 8 connected between its output 9 and its inverting input 10. A further amplifier 11 provides additional amplification. Since the input impedance of the transimpedance amplifier of FIG. 2 is low, the stray capacitance of the diode 1 causes no serious signal integration. However, the front end does not adequately reject low frequency noise due to background infra-red radiation, and this tends to upset the bias point at the input 10 to the amplifier.

The above problems are mitigated by the front end of the present invention which is schematically illustrated in block diagram form in FIG. 3 to which reference will now be made. Current induced in the photodetector diode 1, by received infra-red radiation is amplified by a transimpedance amplifier 12 and is fed as an output voltage to an output terminal 13. The use of a transimpedance amplifier 12 which has a low input impedance overcomes the problem of signal integration present with a high input impedance amplifier and in order to control the bias point of the input of the amplifier 12 and to reduce noise due to ambient radiation, a transadmittance feedback path 14 is provided between the output terminal 13 of the amplifier 12 and an input terminal 15 of that same amplifier. The transadmittance feedback path converts a voltage present at the output terminal 13 into a negative feedback current at the input terminal 15 of the amplifier 12.

Figures 4A, 4B:
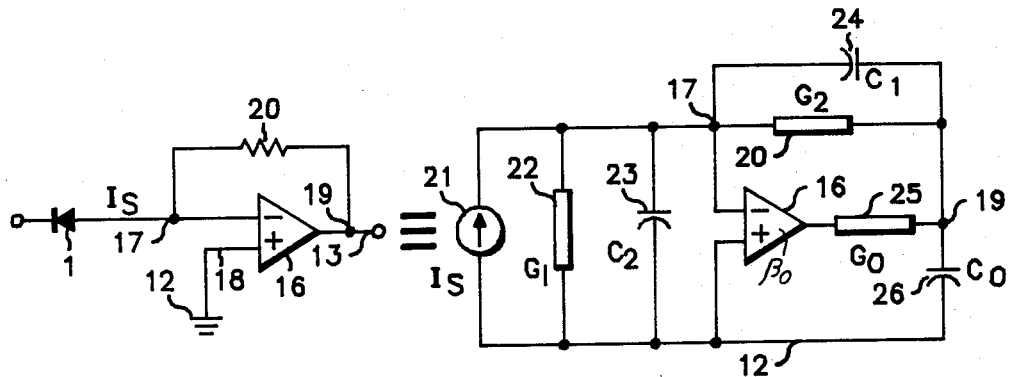

Referring now to FIG. 4a there is shown a more detailed schematic diagram of the transimpedance amplifier 12. This amplifier comprises an operational amplifier 16 having an inverting input 17 and a non-inverting input 18. The non-inverting input 18 is connected to a reference potential 12 whilst the inverting input 17 is fed with an input current generated by the photodetector diode 1. The amplifier 16 has an output terminal 19 and negative feedback to the inverting input 17 is provided by means of a feedback resistor 20 connected between the output terminal 19 and the inverting input 17 of the amplifier 16.

In order to examine the operational characteristics of the transimpedance amplifier of FIG. 4a reference will now be made to the equivalent circuit of this amplifier which is illustrated in FIG. 4b. Like parts in FIG. 4b to those in FIG. 4a bear like reference numerals.

In the equivalent circuit of FIG. 4b, the photodetector diode 1 is represented as a current source 21 feeding the inverting input 17 of the amplifier 16. The input impedance of the amplifier is represented by a resistor 22 connected between the terminal 17 and the reference potential 12 and a shunt capacitor 23 connected across the resistor 22. The resistor 20 has a stray capacitance 24 connected in parallel with it. The amplifier 16 has an output impedance represented by a series resistor 25 and a shunt capacitor 26, the capacitor 26 being connected between the output terminal 19 and the reference potential 12.

In analysing this equivalent circuit, the current generator 21 will be assumed to provide a current $I_S$, the resistor, 20, 22 and 25 will be represented by their conductances $G_2$, $G_1$ and $G_0$, whilst the capacitances 23, 24 and 26 have designated values $C_1$, $C_2$ and $C_0$. The output voltage appearing at terminal 19 is referenced $V_0$. The gain of the amplifier 16 will be assumed to be $\beta_0$.

The transimpedance transfer function $A_{iv}$ of the transimpedance amplifier shown at FIG. 4a and in equivalent circuit form in FIG. 4b is given by $$A_{iv} = \frac{V_0}{I_s} = K_0 \frac{S + \omega_Z}{S^2 + \frac{\omega_p}{q_p} S + \omega_p^2}$$

where S is complex frequency, $$K_0 = \frac{C_2}{d} \text{ and } d = C_0 C_1 + C_2 C_0 + C_2 C_1$$

$$\frac{\omega_p}{q_p} = \frac{C_0 G_1 + C_1 G_0 + C_0 G_2 + C_1 G_2 + C_2 G_1 + C_2 G_0(1 - \beta_0)}{d}$$

$$\omega_p^2 = \frac{G_0 G_1 + G_1 G_2 + G_0 G_2(1 - \beta_0)}{d}$$

$$\omega_Z = \frac{G_2 - \beta_0 G_0}{C_2}$$

$$q_p = \frac{\sqrt{G_0 G_1 + G_1 G_2 + G_0 G_2(1 - \beta_0)} \sqrt{d}}{C_0 G_1 + G_1 G_0 + G_0 G_2 + C_1 G_2 + C_2 G_1 + C_2 G_0(1 - \beta_0)}$$

Under ideal circumstances in which the gain of the amplifier 16 approaches infinity and complex frequency tends to zero, then $$\lim_{\substack{S \to 0 \\ \beta \to \infty}} A_{iv} = \frac{\beta_0}{1 - \beta_0} \cdot \frac{G_2/\beta_0 - G_0}{G_0 G_2} = -1/G_2 = -R_2$$

Under these ideal conditions, the transimpedance transfer function can be seen to be dependent only upon the value of the resistor 20.

Figure 5:
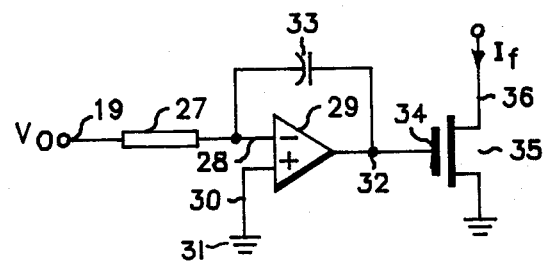
FIG. 5 shows the transmittance feedback path forming part of the front end of FIG. 3.

Referring now to FIG. 5, in order to provide the transadmittance feedback path the terminal 19 at the output of the amplifier 16 is coupled via a resistor 27 to an inverting input 28 of an operational amplifier 29 which also has a non-inverting input 30 connected to a reference potential 31.

The operational amplifier 29 has an output terminal 32 and a capacitor 33 is connected across the amplifier 29 between its inverting input 28 and its output terminal 32. In order to convert output voltage provided by the amplifier 29 into a negative feedback current, the output terminal 32 of the amplifier is connected to a gate input 34 of a field effect transistor 35 whose drain electrode 36 provides the feedback current to the transimpedance amplifier. The voltage at the terminal 19 has already been defined as $V_o$. Assume now that the output voltage of the amplifier 29 appearing at the output terminal 32 and hence at the gate input terminal 34 of the transistor 35, is $V_f$ and that output current provided by the drain electrode 36 of the transistor 35 is $I_f$ then $$\frac{V_0}{V_f} = \frac{1}{SRC} \text{ where } R \text{ is the resistance of}$$

where R is the resistance of the resistor 27, and C is the capacitance of the Capacitor 33.

Also $I_f = G_m V_f$ where $G_m$ is the transconductance of the transistor 35

The transadmittance transfer function of the feedback path shown in FIG. 5 is then given $$F_{iv} = \frac{I_f}{V_0} = \frac{G_m}{ST_1}$$

where $T_1 = RC$.

Figure 3:
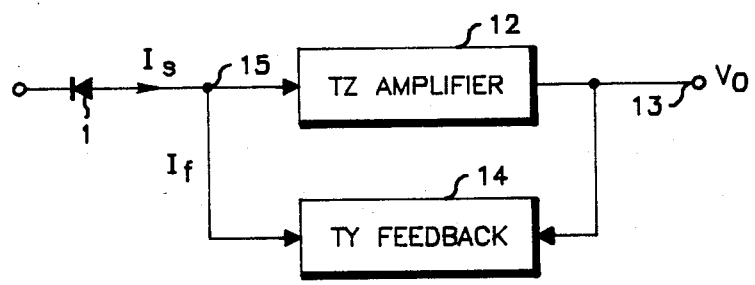
FIG. 3 is a highly schematic block diagram of a front end in accordance with the present invention.

Considering now the overall transimpedance $G_{vi}$ of the entire front end circuit as illustrated in FIG. 3, and consisting of the transimpedance amplifier 12, with parallel transadmittance feedback amplifier, this transimpedance is given by $$G_{vi} = \frac{V_0}{I_S} = \frac{A_{iv}}{1 - A_{iv}F_{iv}}$$

Assuming that the current to voltage transfer ratio $A_{iv}$ is purely resistive and equals $R_2$ then $A_{iv} = -R_2$.

Assuming the transadmittance feedback amplifier is of the form shown in FIG. 5, so that the transadmittance feedback is given by $$F_{vi} = \frac{G_m}{ST_1}$$

then the overall frequency response of the front end circuit is found to be $$\frac{V_0}{I_S} = -R_2 \frac{ST_1}{ST_1 + G_m R_2} = -R_f \frac{ST_1/\alpha}{ST_1/\alpha + 1}$$

Where $\alpha$ is the product $G_m R_2$. As can be seen this is the frequency response of a high pass filter, and therefore low frequency noise due to ambient radiation would be blocked.

The implementation of the transadmittance feedback path by the embodiment illustrated in FIG. 5 is satisfactory except where a large time constant of integration is required since it is not easy to provide large circuit element values in an integrated circuit. In this case, the transadmittance feedback may be provided by the embodiment illustrated in FIG. 6 where like components to those in FIG. 5 bear like reference numerals.

In this embodiment the terminal 19 which provides a voltage from the transimpedance amplifier is connected to one terminal 37 of a switch 38. The switch 38 has a second terminal 39 connected to the input terminal 28 of the operational amplifier 29 and a wiper 40 connected to one terminal of a capacitor 41. The wiper 40 switches between the terminals 37 and 39 such that when connected to the terminal 37 the capacitor 41 is charged by the voltage appearing at the terminal 19 and when the wiper 40 is connected to the other terminal 39 the capacitor 41 discharges into the input terminal 28 of the operational amplifier 29.

By this switching the operational amplifier 29 may be made to operate as an integrating circuit having a relatively high time constant whilst the values of capacitors needed to be used in the circuit are relatively low.

According to the Shannons Theorem a continuous signal which contains no significant frequency component above F HZ may be recovered from its sampled version if the sampling interval is less than $\frac{1}{2}$F seconds. In other words, the switching speed of the switch 38 must be at least two times higher than the highest frequency of the infra-red signal handled by the front end circuit.

The sampling effected by the switch 38 also adds switching noise to the wanted signals, and to reduce this noise, it is desirable to provide a smoothing filter after the operational amplifier 29. This is provided by means of a resistor 42 connected between the output terminal 32 of the amplifier 29, and the gate input 34 of the transistor 35, together with a capacitor 43 connected between the gate input 34 and a reference potential 44.

Assuming $\omega$ is very must less than $\omega_s$ where $\omega$ is the angular frequency of the infra red radiation, and $\omega_s$ is the angular switching frequency of the switch 38, then $$\frac{V_f}{V_0} = \frac{-\alpha}{ST_s}$$

$V_f$ being the voltage appearing at the gate input terminal 34 of the transistor 35, and $T_s$ is the time constant of the smoothing filter formed by the resistor 42 and the capacitor 43.

$$\frac{I_f}{V_f} = G_m$$

and therefore $$F_{vi} = \frac{I_f}{V_0} = -G_m \frac{\alpha}{ST_s}$$

Figure 6:
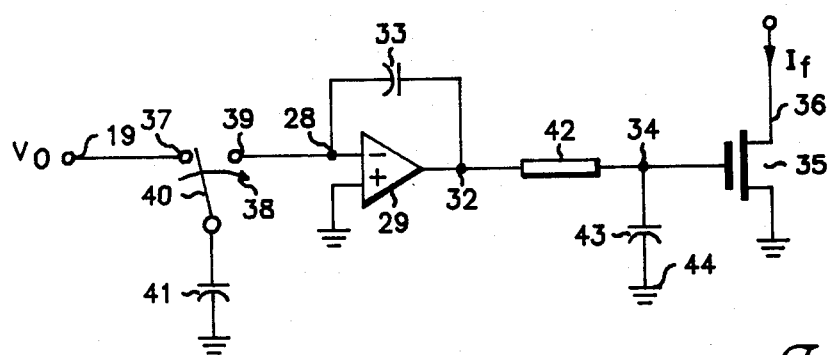
FIG. 6 shows an alternative embodiment of the transmittance feedback path.

The use of this switched capacitor technique of FIG. 6 allows the fabrication of an integrated circuit transadmittance feedback amplifier having a relatively long time constant of integration without the need to integrate high value capacitances.

The invention has been described by way of example and modification may be made without departing from the scope of the invention. In particular the implementation of the transimpedance amplifier and the transadmittance feedback amplifier are given by way of example only and any suitable alternative may of course be employed. For example the transadmittance feedback path may include any kind of frequency selective low pass characteristic with properly chosen cut-off frequencies. Although the front-end circuit has been illustrated in connection with an infra-red receiver utilising a photodetector to provide the input current this is not essential and the input current may be derived from any suitable sensor which may be represented as a current source.

I claim:

1. A front-end circuit suitable for use in an infra-red receiver, the circuit comprising a transimpedance amplifier for providing an output voltage at an output terminal, a current source connected to supply an input current to an input terminal of the transimpedance amplifier; and transadmittance feedback means having a low pass transfer characteristic and connected between the output terminal and the input terminal of the transimpedance amplifier so that unwanted signals in the output voltage due to undesirable low frequency components in the input current are removed.

2. A front end circuit as claimed in claim 1 wherein the transimpedance amplifier comprises an operational amplifier having a input fed with the input current and a negative feedback means connected between its output and the said input.

3. A front end circuit as claimed in claim 2 wherein the said input is the inverting input of the amplifier.

4. A front end circuit as claimed in claim 3 wherein the negative feedback means comprises a resistor connected between the output of the amplifier and the inverting input.

5. A front end circuit as claimed in claim 1 wherein the transadmittance feedback path includes an integrating amplifier.

6. A front end circuit as claimed in claim 5, wherein the integrating amplifier comprises an operational amplifier having an input fed via resistive means from the output of the transimpedance amplifier, and capacitive means coupled between its output and the said input.

7. A front end circuit as claimed in claim 5, wherein the integrating amplifier comprises an operational amplifier having an input, capacitive means coupled between an output of the amplifier and its input, and a switchable capacitor arranged alternately to be charged by a voltage fed from the output of the transimpedance amplifier, and to be discharged into the said input of the operational amplifier.

8. A front end circuit as claimed in claim 7, wherein a smoothing filter is connected to the output of the operational amplifier to reduce noise introduced by switching the switchable capacitor.

9. A receiver front end circuit as claimed in claim 1 and fabricated in integrated circuit form.

10. A front-end circuit as claimed in claim 5 and further including a voltage to current converter coupled in series with the integrating amplifier.

11. A front-end circuit as claimed in claim 10 wherein the voltage to current converter comprises a transistor having a first electrode coupled to the input terminal of the transimpedance amplifier and a second electrode coupled to a reference and a control electrode coupled to the output of the integrating amplifier.

* * * * *